United States Patent [19]

Kyriakides et al.

[11] 3,932,859
[45] Jan. 13, 1976

[54] ELECTRONIC DICTIONARY WITH WORD LENGTH RESPONSIVE DECODER

[75] Inventors: Patricia Faust Kyriakides; James R. Story, both of Miami, Fla.

[73] Assignee: Anastasios Kyriakides, Miami, Fla.

[22] Filed: Mar. 7, 1974

[21] Appl. No.: 449,083

[52] U.S. Cl. ............... 340/324 R; 35/9 B; 35/35 R; 340/152 R
[51] Int. Cl.² ............................................ G06F 3/14
[58] Field of Search ............ 35/5, 6, 9 R, 9 B, 35 R; 340/152 R, 152 T, 153, 324 R, 337

[56] References Cited
UNITED STATES PATENTS

| | | | |
|---|---|---|---|
| 3,052,041 | 9/1962 | Luxton et al. | 35/9 B |
| 3,388,380 | 6/1968 | Coffin, Jr. et al. | 340/152 R |
| 3,612,676 | 10/1971 | Ooba et al. | 35/35 R |
| 3,808,705 | 5/1974 | Schmoyer | 35/6 |

Primary Examiner—Marshall M. Curtis
Attorney, Agent, or Firm—Cushman, Darby & Cushman

[57] ABSTRACT

An electronic dictionary having a keyboard with a plurality of character keys, a clear key and a definition key; a plurality of flip-flops each associated with one of the character keys for indicating the characters in an entered word; a counter for accumulating a count indicating the number of entered characters; a pulse generator enabled upon operation of the definition key to provide a pulse train to a further counter which disables the pulse generator upon a given count; decoder logic receiving as an input the outputs of the flip-flops and the outputs of the two counters to produce a sequence of character codes at an output as the further counter is incremented, such codes being stored in a register and applied to a conventional display to form a definition of an entered word and the clear key then being operated to reset the circuitry and blank the display.

7 Claims, 2 Drawing Figures

ELECTRONIC DICTIONARY WITH WORD LENGTH RESPONSIVE DECODER

DESCRIPTION OF THE PRIOR ART AND SUMMARY OF THE INVENTION

The invention relates to an electronic dictionary for providing visual output defining a word which is entered manually on a keyword.

Looking up the definition of a word in a printed dictionary is a time consuming nuisance, particularly when learning a foreign language or the terms unique to some technical speciality, such as engineering, medicine or law. Frequent interruptions to look up definitions of words not only increase the time required to learn words, but also interrupt the concentration which is needed to efficiently learn.

Devices have been developed in the past for providing a visual display of the definition of a word following entrance of that word into a keyboard forming part of the device. The patents to Ooba et al., 3,612,676; Phillip, 3,457,101; Ashley, 3,414,985; Papayannopoulos, 3,302,513 and Rocca, 2,690,697 all show devices of this type. These devices include strips of microfilm or the like having a plurality of discrete regions each with a reduced word definition. Operating the keyboard to form a certain sequential combination of letters defining a word causes either the film strip or microfilm to be moved in line with a light source to project an image onto the screen or the light source to be moved to project light through a given part of the microfilm. Inherently these devices are bulky, complex and expensive because of the need for mechanisms for locating and projecting an image through the correct portion of the film.

The present invention relates to an electronic dictionary which can be made inexpensively, produced in a very compact, portable package, and which quickly and efficiently produces a visual display of a definition. This is accomplished as discussed below by a combination which includes a keyboard for entering characters which form words and other information. An electronic storage is connected to the keyboard and stores an indication for each character whether that character has been entered into the keyboard. A counter also counts and provides an output indicating the number of characters which have been entered to form a given word. After all the characters forming a chosen word have been manually entered into the keyboard by sequential operation of the appropriate character keys, a definition key on the keyboard is operated which in turn enables a clock which provides a pulse train which is in turn applied to a counter to provide an output indicating the stored count.

The output of this latter counter, the storage indicating which characters have been entered and the counter indicating the number of characters entered are all applied to a decoder logic which can be comprised of conventional logic elements. The decoder provides, for each unique combination, an output defining a given character code. The character codes thus sequentially generated as the counter connected to the pulse generator in incremented are applied to shift registers which store the character codes. The shift registers are in turn connected to conventional alphanumeric display modules to provide a visual display of the definition of the entered word provided by the decoder logic. When the count in the counter connected to the pulse generator reaches a given predetermined number, electronic logic connected to that counter disables the pulse generator. The pulse generator is connected through a delay circuit to the shift registers to enable those registers to receive data from the decoder logic in parallel and through a six-for-one generator circuit to the shift input of the registers to effect shifting of the information as it is sequentially produced by the decoder logic.

Many other objects and purposes of the invention will be clear from the following detailed description of the drawings.

DETAILED DESCRIPTION OF THE DRAWINGS

Figure 1:
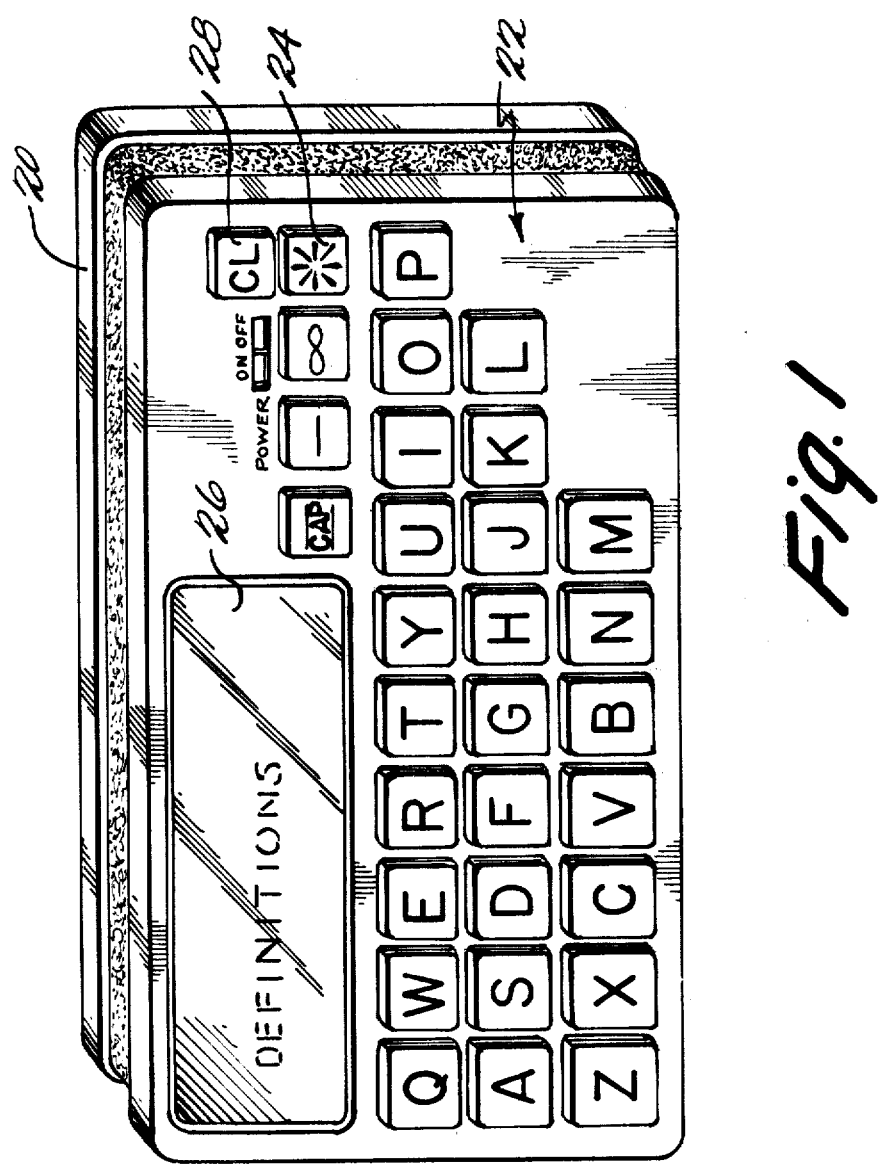
FIG. 1 illustrates a perspective view of the keyboard and exterior housing of the electronic dictionary of this invention.

Reference is now made to FIG. 1 which shows a perspective view of the housing 20 of the unique electronic dictionary of this invention. As can be seen in FIG. 1, the dictionary can be made to be compact and portable, operating either off an internal battery source or connected to a conventional power source. The keyboard is comprised of a number of character keys indicated generally as 22 plus a number of function keys. Definition key 24 is manually operated after all of the characters forming a given word have been entered, and as will be clear from the discussion of circuitry below, operation of key 24 causes a visual display of the word definition to appear on screen 20. Clear entry key 28 is operated when the information which has so appeared on screen 26 has been read and a new word is desired to be entered. Operation of clear key 28 resets all of the circuitry and blanks display 26. Keys 22, 24 and 28 can be any type of conventional electronic or other keyboard in which operation of a key by manually touching or depressing that key produces an appropriate electrical signal.

Figure 2:
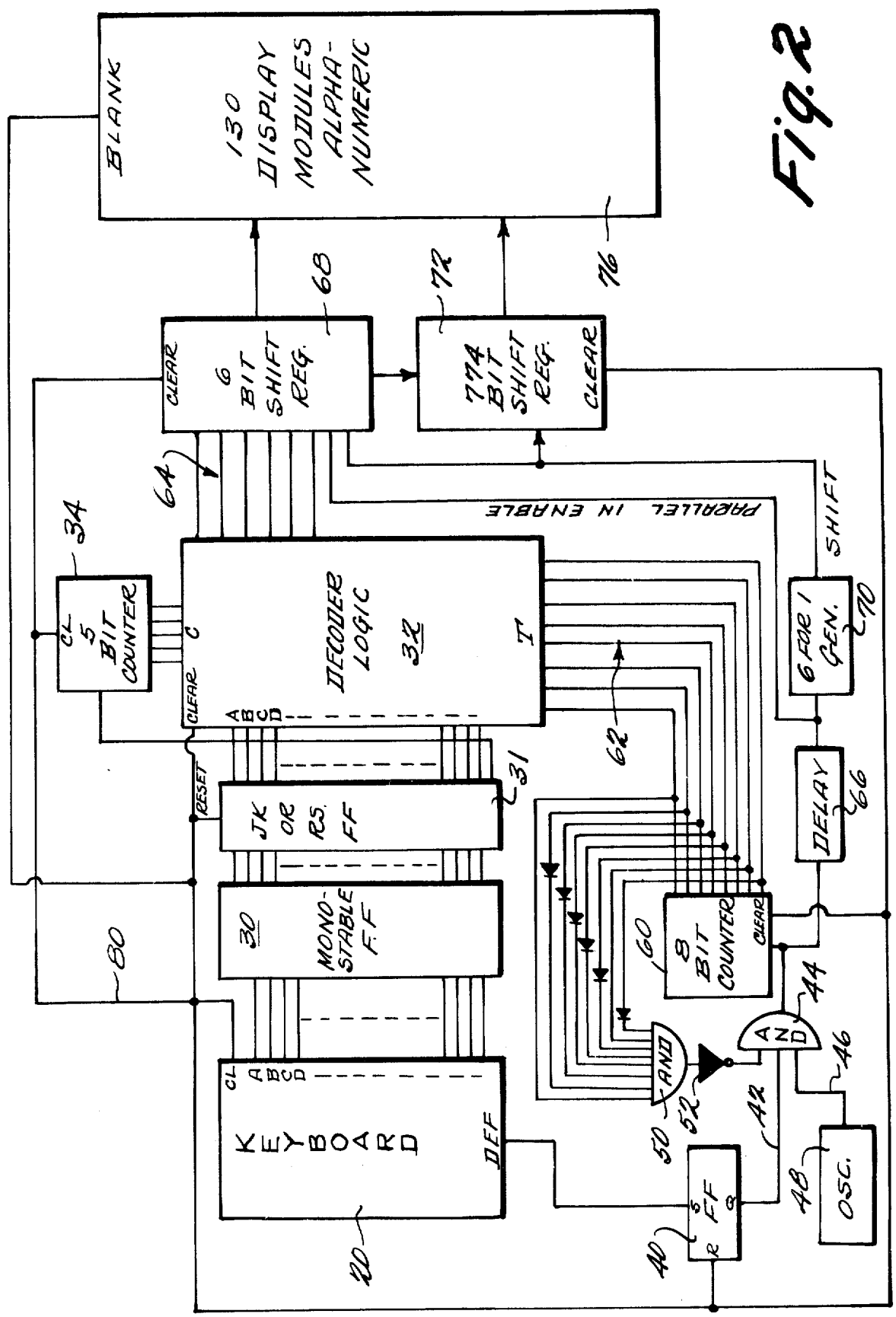
FIG. 2 illustrates a schematic of the electronic circuitry which responds to entrance of a word on the keyboard to provide a visual display of the definition of the entered word.

Reference is now made to FIG. 2 which illustrates a schematic of one embodiment of the electronic dictionary of this invention. As can be seen in FIG. 2 each of the character keys is connected to an associated monostable flip-flop which produces a short pulse when the associated character key is manually operated. Each of the flip-flops generally indicated as 30 are each in turn connected to an RS or JK flip-flop, those flip-flops indicated generally as 31. Flip-flops 31 are connected to decoder logic 32, forming 28 inputs to decoder logic 32. Twenty six of the inputs comprise the 26 letters of the alphabet, while the other two inputs represent a hyphen and a capital letter. Thus, each of the flip-flops 31 indicate whether the associated character has been entered. Flip-flops 31, however, do not indicate the number of times that a character in one word has been entered. Thus, for words which have the same characters, but different numbers of certain of the characters, the outputs of flip-flop 31 will be the same. Such words are differentiated by five bit counter 34.

Counter 34 is connected as illustrated to the output of the flip-flops 30 so that counter 34 counts, and provides an output indicating the number of characters which have been entered for a word. The five bit output of counter 34 is connected to decoder logic 32, and counter 34 thus differentiates between almost all words having multiple letters. There may be a few words which can not be differentiated by this technique. However, this simple use of a counter will deal with almost all situations.

The character keys 22 accordingly are operated in sequence until all of the characters forming the word to be defined have been entered and the associated flip-flops 31 shifted in their output condition to indicate such entrance. Five bit counter 34 indicates the number of characters in the entered word. At this time, definition key 24 is operated to produce an electrical signal which shifts flip-flop 40 to its set condition providing a logic one output on line 42 which is applied as one input to AND gate 44. The second input to AND gate 44 is connected via line 46 to a conventional oscillator 48 providing a train of pulses at any given desired frequency. The third input to AND gate 44 is the output of AND gate 50, inverted by conventional inverter 52. At this time the inverted output of AND gate 50 is also a logical one so that the pulse train from oscillator 38 is passed through gate 34 and applied to eight bit counter 60.

Eight bit counter 60 counts the pulses from oscillator 48 passing through AND gate 44 and provides an output on lines 62 indicating the stored count. Lines 62 are connected to decoder logic 32 providing eight inputs which, together with the inputs from flip-flops 31 and counter 34, define 41 inputs. For each unique input combination, decoder logic 32 provides an output on six bit lines 64, each such output defining a character. The characters thus sequentially produced, as eight bit counter 60 is continuously incremented by the pulses provided by oscillator 48, in effect "define" the word which is represented by the inputs from flip-flop 31 and five bit counter 34.

The pulses from oscillator 48 are also applied via a short conventional delay circuit 66 to the Parallel-In-Enable input to six bit shift register 68 which accordingly receives each coded character output on lines 64. The output of delay circuitry 66 is also applied to a six-for-one generator 70 which produces six pulses for each pulse received. The output of generator 70 is applied to the shift input to registers 68 and 72 so that each received six bit character is shifted into the 74 bit shift register 72 and stored therein. When the count in counter 30 reaches a given number, for example 130, AND gate 50 disables AND gate 44 to prevent further pulses from passing through gate 44.

Registers 68 and 72 are connected to 130 conventional display modules which provide a visual output of the characters which together make up the definition. For the parameters illustrated in FIG. 2, 130 such characters can be displayed. Obviously through the use of greater number of modules and greater numbers shift registers and greater storage in the decoder logic any number of characters forming a definition can be displayed.

When it is desired to blank the display and to clear the circuitry of FIG. 2 in preparation for entrance of another word, clear key 28 is operated to provide a signal output on line 80 which is applied to flip-flop 40 to reset that flip-flop and disable gate 44 preventing oscillator 48 from applying further signals. The clear signal on line 80 is also applied to eight bit counter 60, five bit counter 34, flip-flops 31, registers 68 and 70, and to the blank input to the display modules to reset all of this circuitry in preparation for repeating the above steps.

The decoder logic 32 can be a standard TTL combinational logic where six outputs are based on the 41 input states. Preferably the decoder logic 32 is made to be a plug in logic so that one circuit could be plugged in for one type of dictionary, for example providing legal definitions, and another for another type of dictionary, for example providing medical definitions. The actual combinational logic can be easily designed from a standard truth table from the 41 input variables and six output variables. Logic 32 can be designed to provide any desired number of definitions.

Shift registers 68 and 70 are standard stock logic devices. Register 72 may be comprised of several conventional registers connected together.

Many changes and modifications in the above described embodiment of the invention can of course be carried out without departing from the scope thereof. Accordingly, that scope is intended to be limited only by the scope of the apppended claims.

What is claimed is:

1. An electronic dictionary comprising: keyboard means having a plurality of character keys for entering character symbols which form a word and producing an electrical signal upon each such entrance identifying the character thus entered, and a definition key for producing a definition signal upon operation thereof, means for receiving said electrical signals and storing for each symbol which can be entered an electrical stored indication of whether that symbol has been entered, means for receiving said electrical signals, counting the number of symbols entered and producing an output signal indicating that count, pulse generator means for producing a train of pulses upon operation of said definition key, counter means for receiving said train of pulse and providing a count output indicating the number of pulses counted, logic means connected to said pulse generator means and to said counter means for disabling said pulse generator means when the output of said counter means indicates a given count, decoder logic means connected to said counter means, said receiving and storing means, and said receiving, counting and producing means for producing for each combination of said output signal indicating the count in said receiving, counting and producing means, said stored indication of whether symbols have been entered and said count output of said counter means a definition character signal, register means, for receiving and storing in a given order said definition character signals, and display means for displaying the characters corresponding to said stored definition character signals.

2. A dictionary as in claim 1 wherein said receiving and storing means including a plurality of flip-flops each connected to and associated with one of said character keys for shifting from a first to second electrical condition when the associated character key is operated and means for connecting each of said flip-flops to said decoder logic means.

3. A dictionary as in claim 1 wherein said register means includes shift register means connected to said decoder logic means and to said pulse generator means for entering said definition character signals.

4. A dictionary as in claim 3 further including a delay circuit connected between said pulse generator and a parallel in enable input to said shift register means and a circuit producing a plurality of pulses for each received pulse connected between said delay circuit and a shift input to said shift register means.

5. A dictionary as in claim 1 further including a definition flip-flop connected to said definition key and said pulse generator means so as to shift from a first to second condition upon operation of said definition key to enable said pulse generator means.

6. A dictionary as in claim 5 wherein said keyboard includes a clear key connected to said definition flip-flop to so as to cause said definition flip-flop to shift from said second to said first condition upon operation of said clear key to disable said pulse generator means connected to said receiving and storing means to reset said receiving and storing means upon operation of said clear keys, connected to said receiving, counting and producing means to reset said receiving, counting and producing means to an initial count upon operation of said clear key connected to said counter means to reset said counter mean to an initial count upon operation of said clear key, connected to said register means for clearing said register means upon operation of said clear key and connected to said display means for blanking said display means upon operation of said clear key.

7. An electronic dictionary comprising:
   keyboard means having a plurality of character keys for entering character symbols which form a word and producing an electrical signal upon each such entrance identifying the character thus entered, and a definition key for producing a definition signal upon operation thereof,
   means for receiving said electrical signals and storing for each symbol which can be entered, an electrical stored indication of whether that symbol has been entered,
   means for receiving said electrical signals, counting the number of symbols entered and producing an output signal indicating that count,
   decoder logic means connected to said receiving and storing means, and said receiving, counting and producing means for producing for each combination of said output signal indicating the count and said stored indication of symbols entered a definition character signal defining a plurality of characters and
   means connected to said decoder logic means for displaying the plurality of characters defined by said definition character signal.

* * * * *